United States Patent
Jindal et al.

(10) Patent No.: US 8,521,463 B2
(45) Date of Patent: Aug. 27, 2013

(54) SYSTEM FOR PERFORMING ELECTRICAL CHARACTERIZATION OF ASYNCHRONOUS INTEGRATED CIRCUIT INTERFACES

(75) Inventors: Deepak Jindal, Noida (IN); Amar Nath N. Deogharia, Noida (IN); Shyam S. Gupta, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 378 days.

(21) Appl. No.: 13/093,865

(22) Filed: Apr. 26, 2011

(65) Prior Publication Data

US 2012/0278027 A1    Nov. 1, 2012

(51) Int. Cl.
*G06F 19/00* (2011.01)
*G01R 31/00* (2006.01)

(52) U.S. Cl.
USPC ............ 702/118; 702/120; 714/724; 714/734

(58) Field of Classification Search
USPC ................. 702/117, 118, 119, 120, 122, 123; 703/14; 714/724, 734, 736
See application file for complete search history.

(56) References Cited

U.S. PATENT DOCUMENTS

| 5,412,663 | A  |   | 5/1995 | Kromer |         |
|-----------|----|---|--------|--------|---------|
| 5,526,288 | A  | * | 6/1996 | Sacks et al. | 702/122 |
| 5,737,342 | A  | * | 4/1998 | Ziperovich | 714/736 |
| 6,363,507 | B1 | * | 3/2002 | Truebenbach et al. | 714/734 |
| 6,892,172 | B1 |   | 5/2005 | Singh |         |
| 8,396,682 | B2 | * | 3/2013 | Oh et al. | 702/120 |

* cited by examiner

*Primary Examiner* — John H Le
(74) *Attorney, Agent, or Firm* — Charles Bergere

(57) ABSTRACT

An integrated circuit with a single-channel input/output (I/O) interface and a multi-channel I/O interface includes functional circuits that operate in different clock domains and a test circuit. For a single-channel I/O interface, the test circuit simulates read/write operations by bypassing the functional circuits and performs electrical characterization of the single-channel I/O interface. For a multi-channel I/O interface, the test circuit configures a plurality of channels of the multi-channel interface in a half-duplex mode and performs electrical characterization using data loop back by bypassing the functional circuits.

18 Claims, 3 Drawing Sheets

SYSTEM FOR PERFORMING ELECTRICAL CHARACTERIZATION OF ASYNCHRONOUS INTEGRATED CIRCUIT INTERFACES

BACKGROUND OF THE INVENTION

The present invention relates to integrated circuits, and, more particularly, to a system for performing electrical characterization of integrated circuits.

Integrated circuits are widely used in computer systems for performing various functions. Such circuits also include internal circuits that work in tandem. Examples of such circuits are processors, logic gates, flip-flops, latches, system buses, and so forth. These circuits are often referred to as functional circuits. The functional circuits are driven by a clock. Depending on the system requirements, different functional circuits may require different clock signals for their operation e.g., an integrated circuit may include one set of functional circuits that operates in a first clock domain and another set of functional circuits that operates in a second clock domain. Such integrated circuits are referred to as asynchronous integrated circuits. The data transferred through these functional circuits across multiple clock domains is also asynchronous. The asynchronous operation of such integrated circuits makes accurate testing difficult.

An integrated circuit undergoes rigorous testing before it is deemed fit for operation. One such type of testing involves checking the input/output (I/O) interface signal timing with respect to a reference signal, such as a clock or strobe signal. The I/O interface signals are required to meet certain setup and hold time specifications with respect to the corresponding reference clock or strobe signal. Such testing is referred to as electrical characterization of I/O interfaces. In electrical characterization, Automatic Test Equipment (ATE) is used. For electrical characterization of output interfaces, test patterns are used to configure functional circuits to output actual data at the I/O interface in defined cycles, and the ATE is configured to expect the same data on the I/O interfaces in same cycles. If the output data captured by the ATE does not match the expected test data, the integrated circuit is considered faulty. Similarly for electrical characterization of input interfaces, test patterns are used to configure functional circuits and I/O interfaces in input mode. The ATE is configured to drive defined data patterns on the input pads in defined cycles with required setup and hold margins for a corresponding reference clock signal.

Electrical characterization of asynchronous integrated circuits is much more difficult. Due to the asynchronous nature of the data transfers, the times at which outputs appear at the I/O interfaces are not deterministic. Many factors and process variations are known to introduce this variance, such as temperature, voltage, process variation and the like. Changes in these factors may impact the data transfer timings and lead to cycle-shifted outputs at the I/O interfaces. The ATE would consider such cycle-shifted outputs as erroneous and thus the device would fail electrical characterization.

Electrical characterization techniques LAO perform use the functional circuit path during testing, where an ATE will drive test data on the desired I/O interface and issue clock signals to shift the test data across multiple functional circuits within the integrated circuit. The ATE captures the test data output at an I/O interface and compares it with expected data. However, this kind of functional electrical characterization has many disadvantages. Firstly, the data is transferred through the entire functional circuit path, which takes time and thus increases test time. Secondly, the data has to be driven across multiple clock domains before it is captured at the I/O interface. Further, the ATE must have significant post-processing capabilities and special logic to handle the indeterministic output at the I/O interfaces. Such ATEs are costly and lead to an increase in the test costs.

It would be advantageous to have a test system with that can perform electrical characterization of asynchronous integrated circuit interfaces relatively quickly. It also would be advantageous to reduce the test pattern size and memory requirements of test systems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
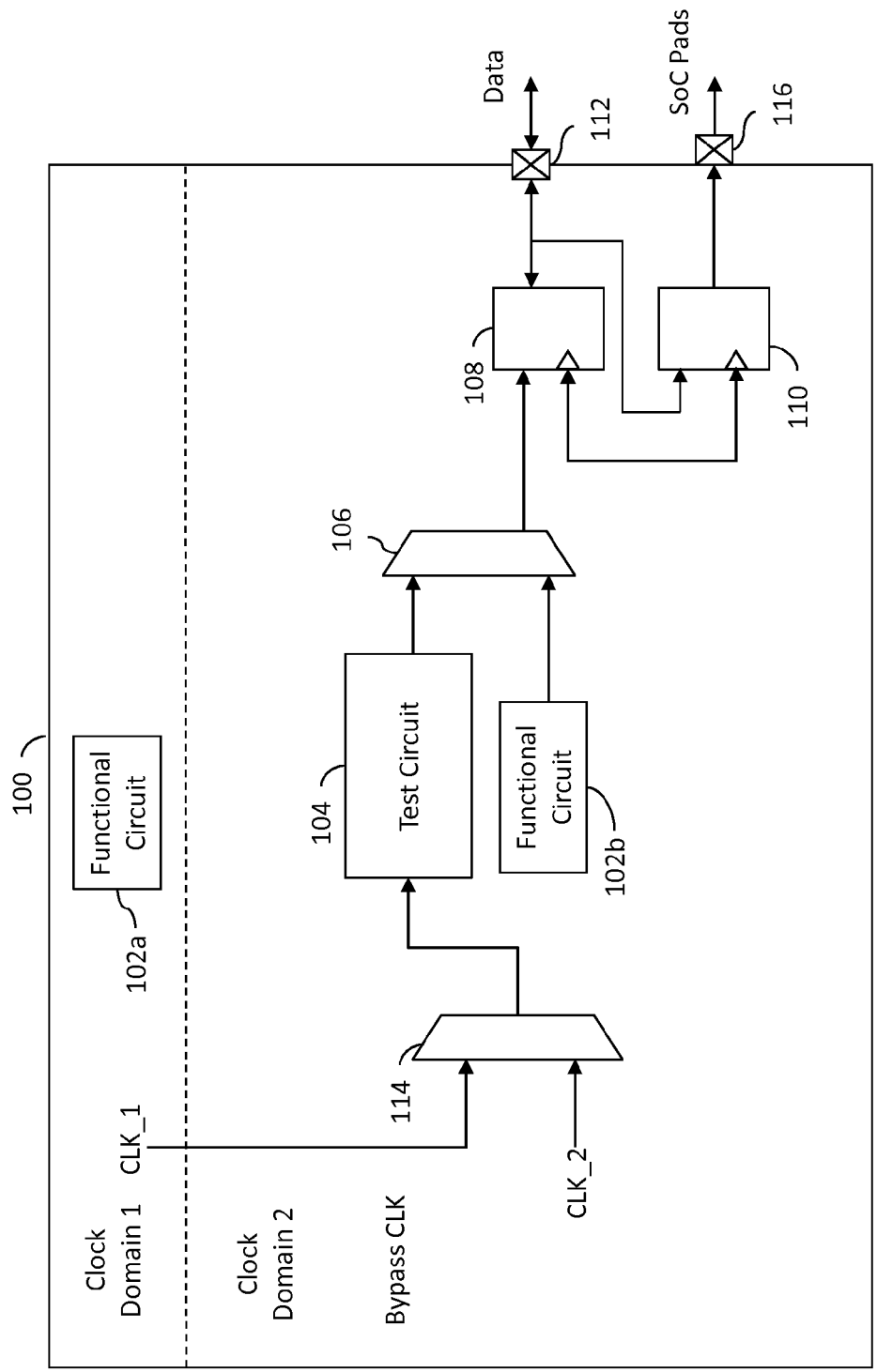
FIG. 1 is a schematic diagram of an integrated circuit with a single-channel interface in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an integrated circuit with a single-channel interface is provided. The integrated circuit includes a plurality of functional circuits, such as a first functional circuit and a second functional circuit. The integrated circuit further includes a plurality of single-channel input/output (I/O) interfaces for performing one or more read/write operations to the integrated circuit by way of the first and second functional circuits; and a capture flip-flop that captures the data at the plurality of single-channel I/O interfaces. The integrated circuit also includes a test circuit for performing electrical characterization of the single-channel I/O interfaces. The test circuit includes at least one of an address register, a command register and a data register for simulating read/write operations. The test circuit simulates the read/write operations using the address, command and data registers, and bypasses the first and second functional circuits. The test circuit drives data from the data register to at least one of the plurality of single-channel I/O interfaces in order to perform transmit channel electrical characterization. The test circuit also configures a first single-channel interface in an input mode for receiving test data from an external tester. A capture flip-flop captures and samples the test data. The sampled test data is observed at a second single-channel I/O interface, thereby performing receive channel electrical characterization.

In another embodiment of the present invention, an integrated circuit with a multi-channel interface is provided. The integrated circuit includes a plurality of functional circuits, including a first functional circuit and a second functional circuit. The multi-channel I/O interface includes a plurality of channels that operate in a half-duplex mode. A test circuit is provided for performing electrical characterization of each channel. The test circuit sets a first channel in a receive mode and a second channel in a transmit mode. The test circuit also configures the first channel to receive input test data. The input test data is sampled at the first channel and transmitted to the second channel by bypassing the first and second functional circuits. As a result, output data is generated at the second channel. The output data is observed by an external tester, thereby performing the electrical characterization of the first and the second channels.

Various embodiments of the present invention provide an integrated circuit with a test circuit for performing electrical characterization of asynchronous integrated circuit interfaces. In the case of a single-channel interface, the test circuit simulates the read/write operations on the I/O interface and bypasses the functional circuits. In the case of a multi-channel interface, the test circuit configures two channels in a half-duplex mode (one in receive mode and the other in transmit mode). It performs electrical characterization of both the channels, one at a time and bypasses the functional circuits. This eliminates the indeterminism of data patterns and helps achieve test pattern stability across all process, temperature and voltage corners. As the address, command, and data instructions are executed by the test circuit, the test data need not travel across multiple asynchronous clock domains. The test circuit drives the data directly at the last stage of the integrated circuit. This reduces the test time considerably. Further, ATE is not required to include expensive and complex logic to handle indeterministic outputs at the I/O interface. This reduces the test pattern size and memory requirements of the ATE, thereby reducing the cost of the ATE.

Referring now to FIG. 1, a schematic diagram of an integrated circuit 100 with a single channel interface in accordance with an embodiment of the present invention is shown. The integrated circuit 100 includes a plurality of functional circuits, such as functional circuit 102a and a functional circuit 102b, a test circuit 104, a multiplexer 106, a launch flip-flop 108, a capture flip-flop 110, a plurality of single-channel input/output (I/O) interfaces, such as a single-channel I/O interface 112, a bypass clock circuit 114, and a plurality of chip pads 116. In various embodiments of the present invention, a functional circuit, such as the functional circuits 102a or 102b, refers to an internal circuit of the integrated circuit 100 through which data may be driven during the operation of the integrated circuit 100. Examples of internal circuits include, but are not limited to, intermediate system buses, processors, flip-flops, latches and other logic circuits. The functional circuits 102a and 102b operate in different clock domains. As shown in FIG. 1, the functional circuit 102a operates in clock domain 1 and the functional circuit 102b operates in clock domain 2. The multiple clock domains lead to asynchronous operation of the functional circuits. The bypass clock circuit 114 is configured to receive clock signals from the clock domains 1 and 2, and generate a bypass clock signal. The bypass clock signal is used to synchronize the operations of the test circuit 104 and the first and second functional circuits 102a and 102b, respectively. In one embodiment of the present invention, a clock signal from the clock domain 1 is used to drive the second functional circuit 102b from the clock domain 2 and the test circuit 104.

The launch flip-flop 108 is configured to receive and buffer data from the test circuit 104. The launch flip-flop 108 represents the last functional stage of the integrated circuit 100 and drives the buffered data to the single-channel I/O interface 112. The capture flip-flop 110 represents the first functional stage of the integrated circuit 100. The capture flip-flop 110 is configured to buffer the test data arriving at the single-channel I/O interface 112 from an external tester and drive the test data to the chip pads 116. In various embodiments of the present invention, the integrated circuit 100 may include a plurality of launch and capture flip-flops 108 and 110, respectively. The chip pad 116 may be any generic I/O interface of the integrated circuit 100. In an embodiment of the present invention, the single-channel I/O interface 112 may be an external memory interface. The external memory interface may be used with multiple memory devices, such as a static random access memory (SRAM), dynamic random access memory (DRAM) and static dynamic random access memory (SDRAM). In another embodiment of the present invention, the single-channel I/O interface 112 may be a parallel in-phase and quadrature phase (PIQ) interface used for receiving data from radios.

For ease of explanation, the operation of the integrated circuit 100 has been explained with reference to an external memory interface. During electrical characterization, an external tester (such as an ATE) is connected to the single-channel I/O interface 112 of the integrated circuit 100. In conventional operation, when writing data to an external memory, the data is driven through the functional circuits 102a and 102b and launched at the single-channel I/O interface 112, thereby performing transmit channel electrical characterization. Similarly, for performing receive channel electrical characterization, functional circuits 102a and 102b are used to configure the external memory interface in a read mode and the external tester drives data to the external memory interface through a first single channel I/O interface. The data is driven through the functional circuits 102a and 102b and appears at a second single-channel I/O interface and is captured by the external tester. The shifting of data through multiple functional circuits operating in different clock domains increases the indeterminism of data.

To remove the indeterminism, the test circuit 104 is used to simulate the read/write operations. The multiplexer 106 is used to select either the functional data path or the test data path. The bypass clock signal drives the test circuit 104. For transmit channel electrical characterization, the test circuit 104 generates the address, command, and data instructions to simulate write operations and drives data to the single-channel I/O interface 112. Similarly, for receive channel electrical characterization, the test circuit 104 generates the address, command, and data instructions to simulate read operations. An external tester drives input test data at the single-channel I/O interface 112. The input data is captured at the capture flip-flop 110 and compared against the test data.

Figure 2:
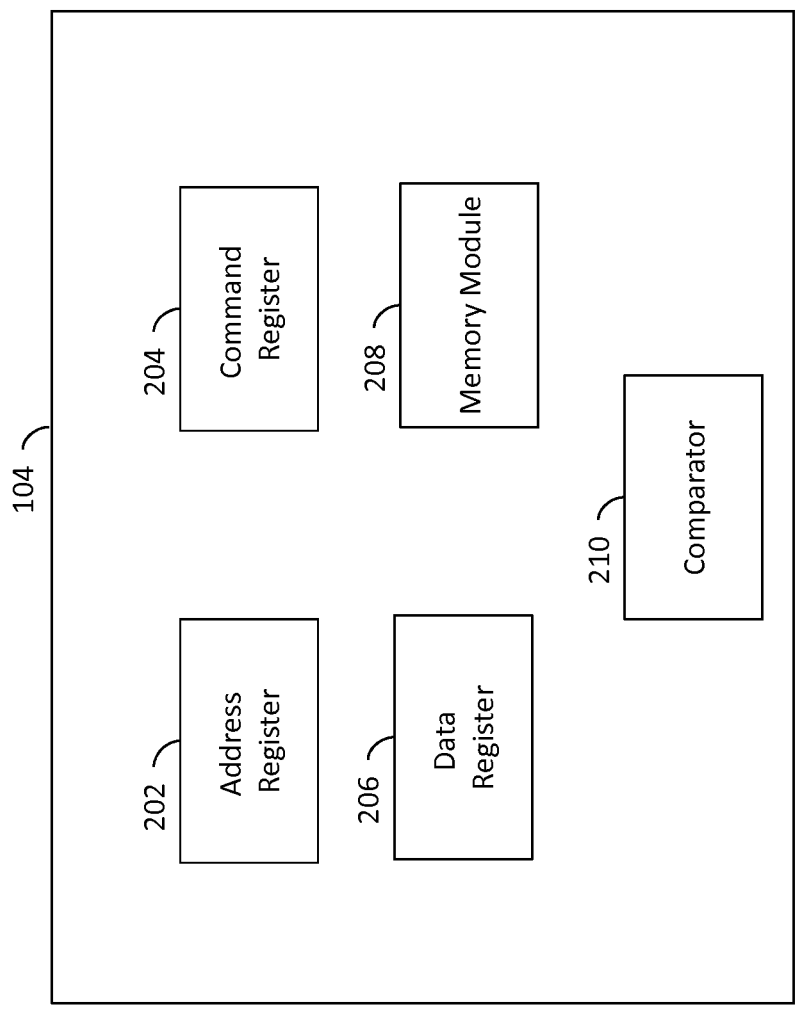
FIG. 2 is a schematic block diagram showing the functional components of a test circuit of the integrated circuit of FIG. 1 in accordance with an embodiment of the present invention.

FIG. 2 is a schematic block diagram of the test circuit 104 used in the integrated circuit 100 in accordance with an embodiment of the present invention. The test circuit 104 includes an address register 202, a command register 204, a data register 206, a memory module 208 and a comparator 210. The memory module 208 is used to store a set of pre-programmed values for simulating read/write operations. In an embodiment of the present invention, a plurality of test patterns is loaded in the memory module 208. The test patterns generate the pre-programmed values for programming the address register 202, command register 204 and data register 206. The address register 202, command register 204 and data register 206 drive the test data at the single-channel I/O interfaces of the integrated circuit 100 for performing the electrical characterization. In another embodiment of the present invention, the test patterns and the pre-programmed values are randomly generated to achieve simultaneous toggling of I/O pads.

During transmit channel electrical characterization, the test patterns corresponding to a write operation are fetched from the memory module 208 and corresponding values are loaded in the address register 202, the command register 204, and the data register 206. The test circuit 104 executes the address, command, and data instructions and drives data from the data register 206 to the single-channel I/O interface 112, thereby bypassing the functional circuits 102a and 102b. The data is buffered in the launch flip-flop 108 and made available at the single-channel I/O interface 112. An external tester (not shown) captures the test data for observation and performs the transmit channel electrical characterization.

During receive channel electrical characterization, the test patterns corresponding to a read operation are fetched from the memory module and corresponding values are loaded in the address, command registers 202 and 204. Thereafter, the test circuit 104 executes the address and command instructions. The external tester drives input test data at the single-channel I/O interface 112. The capture flip-flop 110 captures and samples the input test data. The sampled input test data is made available at the SoC pad 116. An external tester (not shown) is used to observe the sampled input test data. The external tester performs a bit-by-bit observation and comparison of the sampled input data with expected test data. In an embodiment of the present invention, the comparator 210 compares the captured sampled input test data with predetermined test data to determine the data accuracy. In various embodiments of the present invention, the integrated circuit 100 includes multiple single-channel I/O interfaces. Thus, a plurality of single-channel I/O interfaces may be tested simultaneously by driving data to one single-channel I/O interface and observing the data at other SoC pads, such as the SoC pad 116.

Figure 3:
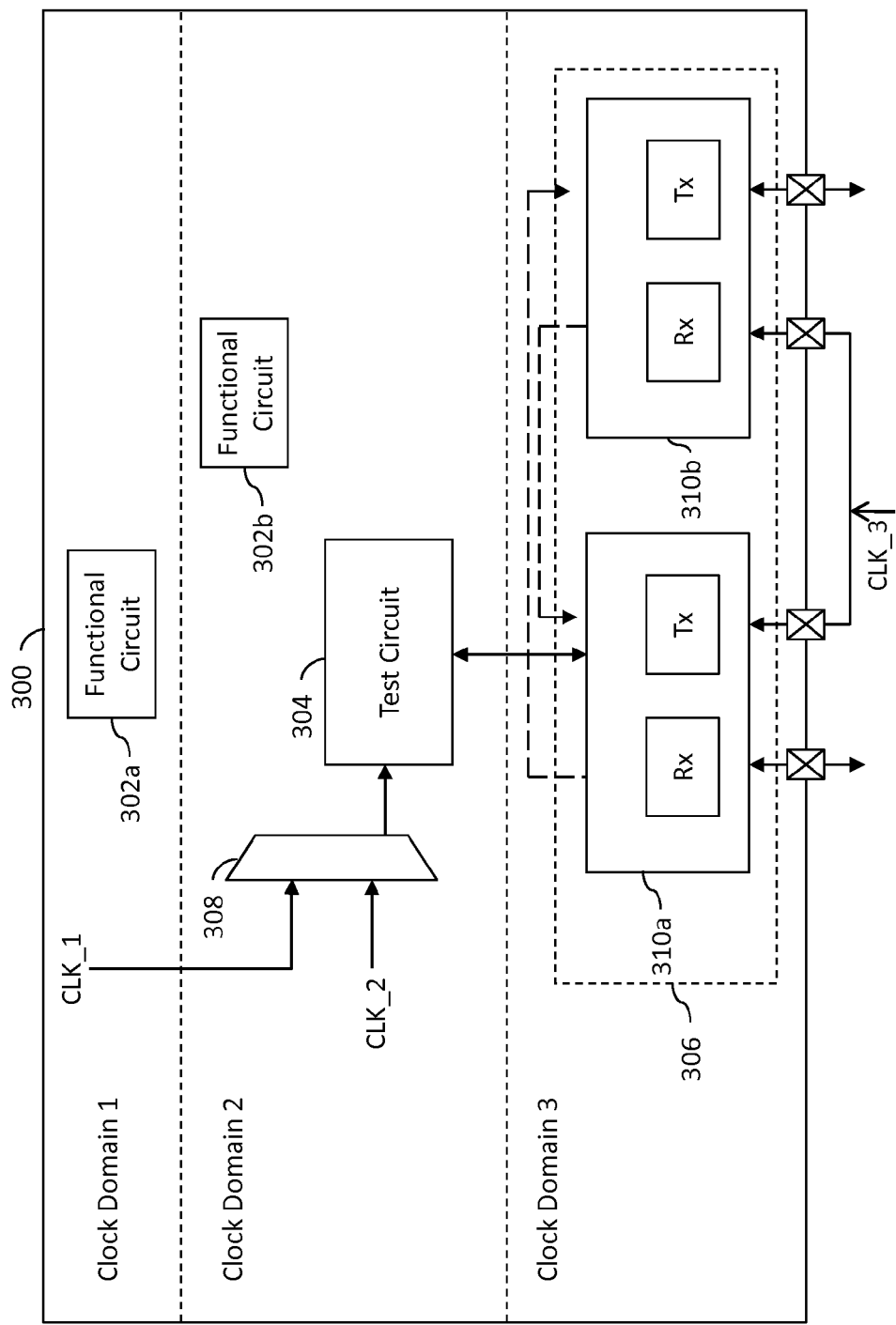
FIG. 3 is a schematic diagram of an integrated circuit with a multi-channel interface in accordance with an embodiment of the present invention.

Referring now to FIG. 3, a schematic diagram of an integrated circuit 300 with a multi-channel interface in accordance with an embodiment of the present invention is shown. The integrated circuit 300 includes a plurality of functional circuits 302a and 302b (two are shown but it is to be understood there could be many more), a test circuit 304, a multi-channel interfaces 306, and a bypass clock circuit 308. The multi-channel I/O interface 306 includes a plurality of channels 310a and 310b (again, two are shown for simplicity of explanation). The functional circuits 302a and 302b operate in multiple clock domains. As shown in FIG. 3, the functional circuit 302a operates in clock domain 1 and the functional circuit 302b operates in clock domain 2. The multiple clock domains lead to asynchronous operation of the plurality of functional circuits. The bypass clock circuit 308 is configured to receive clock signals from the clock domains 1 and 2, and generate a bypass clock signal. The bypass clock signal is used to synchronize the operations of the first and the second functional circuits, 302a and 302b, respectively. In an embodiment of the present invention, a clock signal from clock domain 1 is used to drive the second functional circuit 302b from clock domain 2 and the test circuit 304.

In various embodiments of the present invention, the channels 310a and 310b are operated in a half-duplex mode. In other words, the channels 310a and 310b may be configured in a receive mode or a transmit mode. The test circuit 304 is driven by the bypass clock signal and includes a memory module and a comparator (not shown). In an embodiment of the present invention, the test circuit 304 may lie in clock domain 3 and a separate clock signal from the clock domain 3 may be used to drive the test circuit 304. The clock signal may be provided by the external tester. The memory module stores a set of pre-programmed values for configuring the channels 310a and 310b, into half-duplex mode. In an embodiment of the present invention, a plurality of test patterns is loaded in the memory module. The test patterns generate pre-programmed values for configuring the channels, 310a and 310b, into half-duplex mode. In another embodiment of the present invention, the test patterns and the subsequent pre-programmed values may be randomly generated. In an embodiment of the present invention, multi-channel I/O interface 306 may be a radio front-end digital parallel interface.

In operation, the test circuit 304 configures the channel 310a in a receive mode and the channel 310b in a transmit mode. For performing receive electrical characterization of the channel 310a, an external tester (not shown) drives input test data with expected input specifications to the channel 310a which is sampled for observation. The sampled input test data is driven to the channel 310b where it is observed by the external tester and compared with expected output data to determine data accuracy. The output specifications for the channel 310b are relaxed during receive characterization, thereby allowing the external tester to observe correct data at the channel 310b. If the sampled input test data is incorrect (due to the integrated circuit 300 not meeting the expected input specifications), it is implied that the data appearing at the channel 310b is incorrect. During transmit electrical characterization of the channel 310b, the input specifications are relaxed. The external tester again drives input test data to the channel 310a which is sampled and looped back to the channel 310b, thereby generating output data. The output data is now compared with expected output specifications to determine data accuracy. If the output data does not appear at desired time, then the integrated circuit 300 does not meet required output specifications. In various embodiments of the present invention, the test circuit 304 may include a transaction generator (not shown) which may initiate data receive transactions on the channel 310a and data transmit transactions on the channel 310b. In an embodiment of the present invention, a comparator (not shown) compares the sampled input test data with predetermined test data to determine data accuracy.

Thereafter, the test circuit 304 configures the channel 310a in a transmit mode and the channel 310b in a receive mode, and the same process is repeated. Thus, the receive and the transmit channel characterization are achieved by bypassing the functional circuits 302a and 302b, thereby reducing the test time.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What claimed is:

1. An integrated circuit, comprising:
    a plurality of functional circuits including a first functional circuit and a second functional circuit;
    a plurality of input/output (I/O) pads coupled to the plurality of functional circuits;
    a plurality of single-channel I/O interfaces for performing one or more read/write operations to the integrated circuit by way of the first and second functional circuits;
    a capture flip-flop for capturing data at the plurality of single-channel I/O interfaces; and a test circuit for performing electrical characterization of the plurality of single-channel I/O interfaces, wherein the test circuit includes at least one of an address register, a command register and a data register for simulating the one or more read/write operations, and wherein the test circuit is configured for:

simulating the one or more read/write operations by way of the at least one of the address register, the command register and the data register, such that the read/write operations bypass the first and the second functional circuits, and driving data from the data register to at least one of the plurality of single-channel I/O interfaces in order to perform transmit channel electrical characterization;

configuring a first single-channel interface in an input mode for receiving test data from an external tester, capturing the test data by way of the capture flip-flop, wherein the capture flip-flop samples the test data, and driving the sampled test data to at least one of the plurality of I/O pads in order to perform receive channel electrical characterization.

2. The integrated circuit of claim 1, wherein the test circuit further comprises a comparator for comparing the captured test data with predetermined test data to determine data accuracy.

3. The integrated circuit of claim 1, wherein the test circuit further comprises a memory module for storing a set of pre-programmed values for simulating the one or more read/write operations.

4. The integrated circuit of claim 1, wherein the first functional circuit operates in a first clock domain and the second functional circuit operates in a second clock domain.

5. The integrated circuit of claim 4, further comprising a bypass clock circuit for receiving clock signals from the first and second clock domains and generating a bypass clock signal, wherein the bypass clock signal synchronizes the operations of the first and second functional circuits.

6. The integrated circuit of claim 5, wherein the bypass clock signal drives the test circuit.

7. The integrated circuit of claim 4, wherein a clock signal from the first clock domain drives the second functional circuit.

8. The integrated circuit of claim 1, further comprising a launch flip-flop for driving data from the data register to the at least one of the plurality of single-channel I/O interfaces.

9. The integrated circuit of claim 1, wherein the at least one of the plurality of single-channel I/O interfaces is a parallel in-phase and quadrature phase (PIQ) interface.

10. The integrated circuit of claim 1, wherein the at least one of the plurality of single-channel I/O interfaces is an external memory interface.

11. An integrated circuit, comprising:
a plurality of functional circuits including a first functional circuit and a second functional circuit;
a multi-channel input/output (I/O) interface, wherein the multi-channel I/O interface comprises a plurality of channels that operate in a half-duplex mode; and
a test circuit for performing electrical characterization of each of the plurality of channels, and wherein the test circuit is configured for:
setting a first channel of the plurality of channels to a receive mode;
setting a second channel of the plurality of channels to a transmit mode;
receiving input test data at the first channel;
sampling the input test data at the first channel;
transmitting the sampled input test data to the second channel by bypassing the first and second functional circuits; and
generating output data at the second channel, thereby performing the electrical characterization of the first and second channels.

12. The integrated circuit of claim 11, wherein the test circuit further comprises a comparator for comparing the sampled input test data with predetermined test data to determine data accuracy.

13. The integrated circuit of claim 11, wherein the test circuit comprises a memory module for storing a set of pre-programmed values for configuring the plurality of channels in the half-duplex mode.

14. The integrated circuit of claim 11, wherein the first functional circuit operates in a first clock domain and the second functional circuit operates in a second clock domain.

15. The integrated circuit of claim 14, further comprising a bypass clock circuit for receiving clock signals from the first and second clock domains and generating a bypass clock signal that synchronizes the operations of the first and second functional circuits.

16. The integrated circuit of claim 15, wherein the bypass clock signal drives the test circuit.

17. The integrated circuit of claim 15, wherein a clock signal from the first clock domain drives the second functional circuit.

18. The integrated circuit of claim 11, wherein the multi-channel I/O interface is a radio front-end digital, parallel interface.

* * * * *